(12) United States Patent
Goto et al.

(10) Patent No.: US 6,347,602 B2
(45) Date of Patent: Feb. 19, 2002

(54) PLASMA PROCESSING APPARATUS

(75) Inventors: Naohisa Goto, Hachioji; Makoto Ando, Kawasaki; Nobuo Ishii, Minoo, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/727,711

(22) Filed: Dec. 4, 2000

Related U.S. Application Data

(63) Continuation of application No. PCT/JP99/03008, filed on Jun. 4, 1999.

(30) Foreign Application Priority Data

Jun. 4, 1998 (JP) .............................. 10-172208

(51) Int. Cl.$^7$ ............................ C23C 16/00; H05H 1/00
(52) U.S. Cl. ....................... 118/723 MW; 118/723 MR; 118/723 AN; 156/345
(58) Field of Search .............................. 118/723 MW, 118/723 ME, 723 MR, 723 MA, 723 AN; 156/345; 315/111.21, 111.31, 111.41, 111.51, 111.61, 111.71

(56) References Cited

U.S. PATENT DOCUMENTS 5,698,036 A * 12/1997 Ishii et al. ........... 118/723 MW

FOREIGN PATENT DOCUMENTS

| JP | 01-184923 | 7/1989 | |
| JP | 6-136541 A | * 5/1994 | ........... C23C/16/50 |
| JP | 07-296989 | 11/1995 | |
| JP | 09-63793 | 3/1997 | |
| JP | 09-148308 | 6/1997 | |

OTHER PUBLICATIONS

Form PCT/IB/308—Notice Informing the Applicant of the Communication of the International Application to the Designated Offices.
Form PCT/IF/304—Notification Concerning Submission or Transmittal of Priority Document.
Form PCT/IPEA/401.
Form PCT/ISA/220.
Form PCT/ISA/210—International Search Report (in Japanese).
Notification of Transmittal of Copies of Translation of the International Preliminary Examination Report (Form PCT/IB/338).
Translation of International Preliminary Examination Report (Form PCT/IPEA/409).

* cited by examiner

Primary Examiner—Gregory Mills
Assistant Examiner—P. Hassanzadeh
(74) Attorney, Agent, or Firm—Smith, Gambrell & Russell, LLP

(57) ABSTRACT

In the plasma processor, the microwaves generated from a microwave generator (86) are led to a plane antenna (62), which in turn introduces exponentially attenuating microwaves into a container (22) that processes an object (W) in plasma. Microwave absorption device (96) provided in the circumference of the plane antenna (62) absorbs microwaves propagating from the center of the plane antenna (62) and suppresses the reflection. As a result, the microwaves reflected in the circumference of the plane antenna (62) and returned to the center are decreased to some degree, and the electromagnetic field distribution of the microwave becomes uniform.

4 Claims, 5 Drawing Sheets

PLASMA PROCESSING APPARATUS

This application is a continuation of International Application PCT/JP99/03008, filed Jun. 4, 1999, and which is incorporated herein by reference.

TECHNICAL FIELD

The present invention relates to a plasma processing system that supplies plasma producing energy by propagating microwave radiation from the surface of an antenna into a space defined by a processing vessel to produce a plasma.

BACKGROUND ART

A plasma processing system is used in a semiconductor device fabricating process for film formation, etching, ashing or the like to deal with the recent progressive device miniaturization and device density increase in semiconductor integrated circuits. Particularly, microwave plasma processing systems capable of producing a high-density plasma by a combination of microwave radiation and a magnetic field created by an annular coil are used prevalently because microwave plasma processing systems are capable of stably producing a plasma in an atmosphere of a comparatively low pressure in the range of 0.1 to several tens mtorr.

A conventional microwave plasma processing system of this kind disclosed in JP-A No. 3-17273 has a plasma producing chamber provided with a magnetic field creating means, and a waveguide connected to the plasma producing chamber to guide microwaves. The microwave plasma processing system produces a dense plasma by electron cyclotron resonance using microwaves.

FIG. 5 is a schematic view of the conventional plasma processing system by way of example. In this plasma processing system, a processing vessel 2 is provided on its upper end with a microwave transmitting window 4. Microwaves of, for example, 2.45 GHz generated by a microwave generator 6 are guided by, for example, a rectangular waveguide 8 to a disk-shaped antenna 10 provided with a plurality of slits. A slow-wave member 12 of a dielectric material, such as a ceramic material, is bonded to the upper surface of the antenna 10 to shorten the wavelength of the microwaves for the improvement of the energy efficiency of the microwave.

The microwaves radiated by the antenna 10 propagate through the microwave transmitting window 4 into the processing vessel 2. Then, a dense plasma is produced in the processing vessel 2 by electron cyclotron resonance (ECR) caused by the microwaves and a magnetic field created by a magnet 14 surrounding an upper portion of the processing vessel 2.

The microwaves propagated through the waveguide 8 and a rectangular/coaxial converter 9 along a coaxial line 16 spread from a central portion of the disk-shaped antenna 10 toward a peripheral portion of the same and are radiated into the processing vessel 2 to supply energy. The energy of the microwaves is supplied into the processing vessel 2 by two energy supplying methods discriminated from each other by the form of the slits of the plane antenna 10.

A first energy supplying method uses an antenna provided with slits arranged at a radial pitch approximately equal to one guide wavelength, i.e., a wavelength determined by the slow-wave member 12, of the microwaves. A second energy supplying method uses an antenna provided with slits arranged at a small radial pitch far shorter than the guide wavelength of the microwaves, such as a pitch in the range of about $1/20$ to $1/30$ of the guide wavelength. When the antenna provided with the slits formed at the former radial pitch is used, the microwaves of the same phase propagate downward through the slits as the microwaves spread from a central portion toward a peripheral portion of the antenna, whereby a plasma is produced.

When the antenna provided with the slits formed at the latter radial pitch is used, the microwaves leak little by little through the slits as the same spread from a central portion toward a peripheral portion of the antenna. The microwaves leaked through the slits produce a plasma. The leakage microwaves attenuate exponentially with distance toward a wafer, i.e., toward the bottom of the processing vessel.

A plasma processing system provided with an antenna provided with slits formed at the foregoing small radial pitch is capable of producing and maintaining a plasma by appropriate power (1 to 2 kW for 500 mm in diameter) at a pressure (for example, around 1 mTorr) lower than that required by a plasma processing system provided with an antenna provided with slits formed at the foregoing radial pitch approximately equal to one guide wavelength, without using ECR using an external magnetic field.

However, the antenna provided with the slits formed at the small radial pitch generally is designed to enhance power efficiency by reflecting the microwaves, which is radially propagated from a central portion toward a peripheral portion of the antenna, toward the central portion by the peripheral portion. Thus, there is a tendency for electromagnetic field intensity around the center of the antenna to be higher than that around the peripheral portion of the same.

Consequently, an electromagnetic field intensity on a central region of a surface of a wafer is higher than that on a peripheral region of the same as shown in FIG. 6. Therefore, the plasma is distributed irregularly over the surface of the wafer and hence intra-surface uniform plasma processing of the wafer cannot be achieved.

A system disclosed in JP-A No. 3-224225 discloses a microwave absorber in a waveguide to make uniform the distribution of electromagnetic field intensity of microwaves. This conventional system, however, guides microwaves directly into a discharge tube without using any antenna. Therefore, the technical idea of this conventional system cannot be applied as it is to a system provided with an antenna and the conventional system is unable to achieve the delicate control of the absorption of microwaves.

The present invention has been made in view of the foregoing problems to solve those problems effectively and it is therefore an object of the present invention to provide a plasma processing system capable of making uniform the distribution of electromagnetic field intensity of microwaves by reducing microwaves reflected by a peripheral portion of a plane antenna toward a central portion of the same to some extent.

DISCLOSURE OF THE INVENTION

To solve the foregoing problems, the present invention provides a plasma processing system comprising a processing vessel in which an object to be processed is subjected to a plasma process; a plane antenna for radiating microwaves that attenuate exponentially into the processing vessel; a microwave generator for generating microwaves to be propagated to the plane antenna; a waveguide means for guiding the microwaves generated by the microwave generator to a central portion of the plane antenna; a microwave reflecting member surrounding a peripheral portion of the plane antenna to reflect microwaves, which is propagated from the central portion toward the peripheral portion of the plane antenna, toward the central portion of the plane antenna; and a microwave absorbing means disposed in the peripheral portion of the plane antenna to absorb part of the microwaves that propagate therethrough.

The microwaves propagated from the central portion toward the peripheral portion of the plane antenna and reflected by the microwave reflecting means are absorbed partly by the microwave absorbing means, so that the microwaves are attenuated. Thus, the excessive increase in electromagnetic field intensity of the microwaves in the central portion of the plane antenna is suppressed and, consequently, the electromagnetic field intensity distribution in the processing vessel can be significantly improved.

The microwave absorbing means may include a liquid container disposed in a peripheral portion of the plane antenna; and a microwave absorbing liquid contained in the liquid containers to cause a dielectric loss.

The microwave absorbing means may include a plurality of concentric, annular liquid container disposed in a peripheral portion of the plane antenna; and a microwave absorbing liquid selectively contained in the liquid containers to cause a dielectric loss. The absorbed amount of microwaves can be properly controlled by introducing the absorbing liquid selectively in the liquid containers. Thus, the electromagnetic field intensity distribution in the processing vessel can be further improved.

The plurality of liquid containers may have different radial thicknesses, respectively. The absorbed amount of microwaves can be changed in smaller steps by changing the combination of the liquid containers of different radial thicknesses containing the microwave absorbing liquid to achieve more accurate, fine control of the electromagnetic field intensity distribution.

The plasma processing system may further comprise a circulating means for circulating the microwave absorbing liquid outside the liquid container(s), and a cooling means for cooling the microwave absorbing liquid circulated by the circulating means. The variation of dielectric loss due to the variation of the temperature of the microwave absorbing liquid contained in the liquid container(s) can be suppressed by preventing the temperature of the microwave absorbing liquid from rising. Thus, the uniformity of the electromagnetic field intensity distribution can be further stabilized.

BEST MODE FOR CARRYING OUT THE INVENTION

Figure 1:
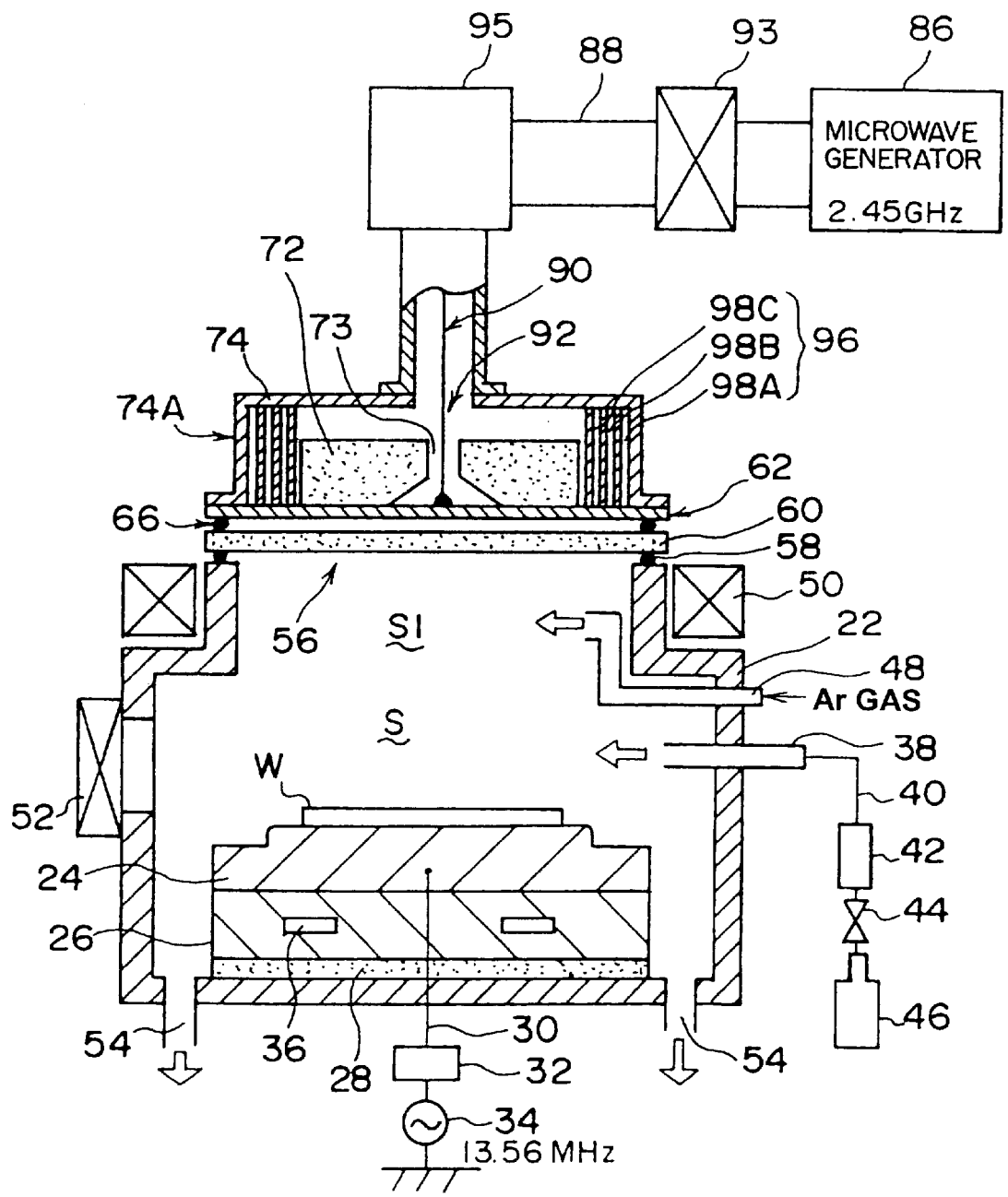
FIG. 1 is a typical longitudinal sectional view of a plasma etching system as a plasma processing system in a preferred embodiment according to the present invention.
Figure 2:
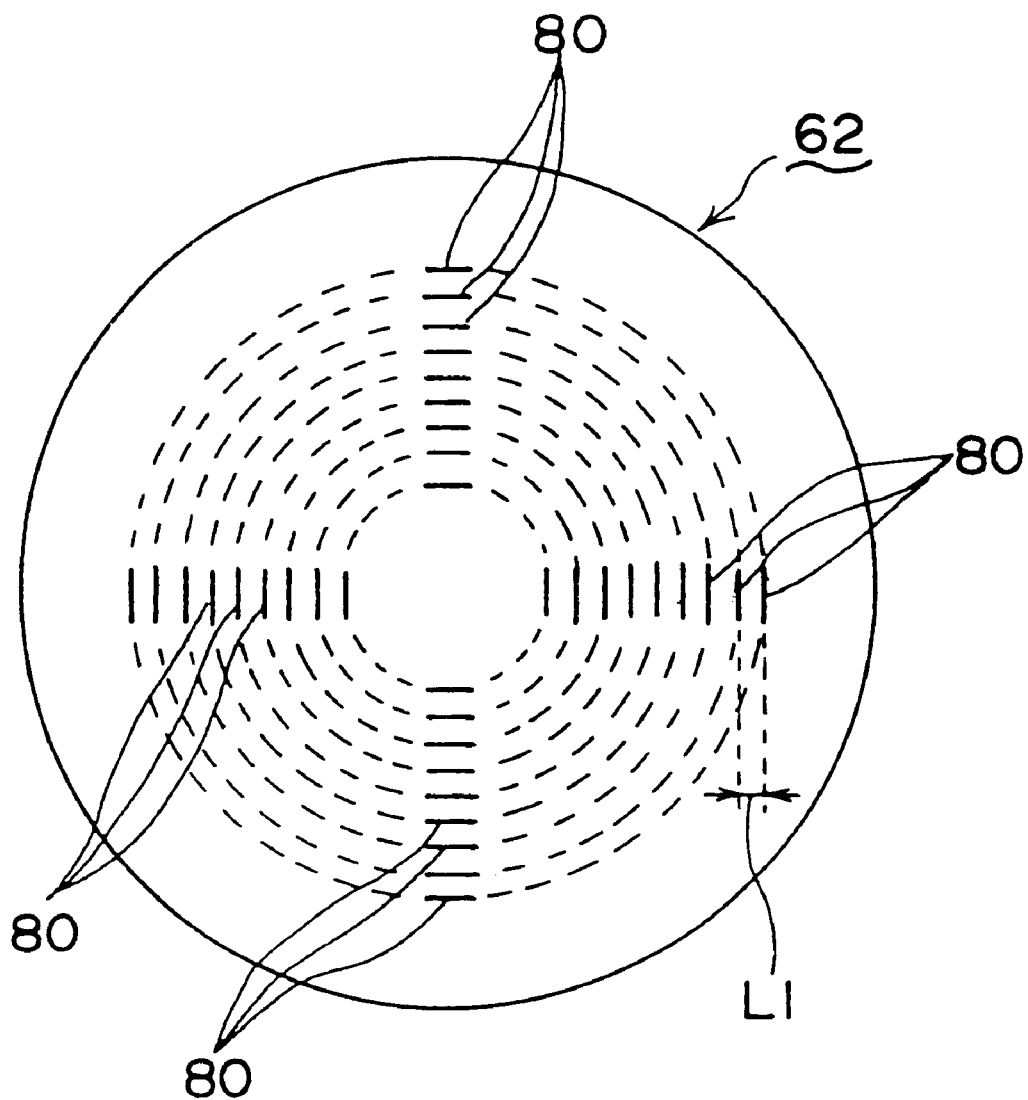
FIG. 2 is a plan view of a plane antenna included in the plasma etching system shown in FIG. 1.
Figure 3:
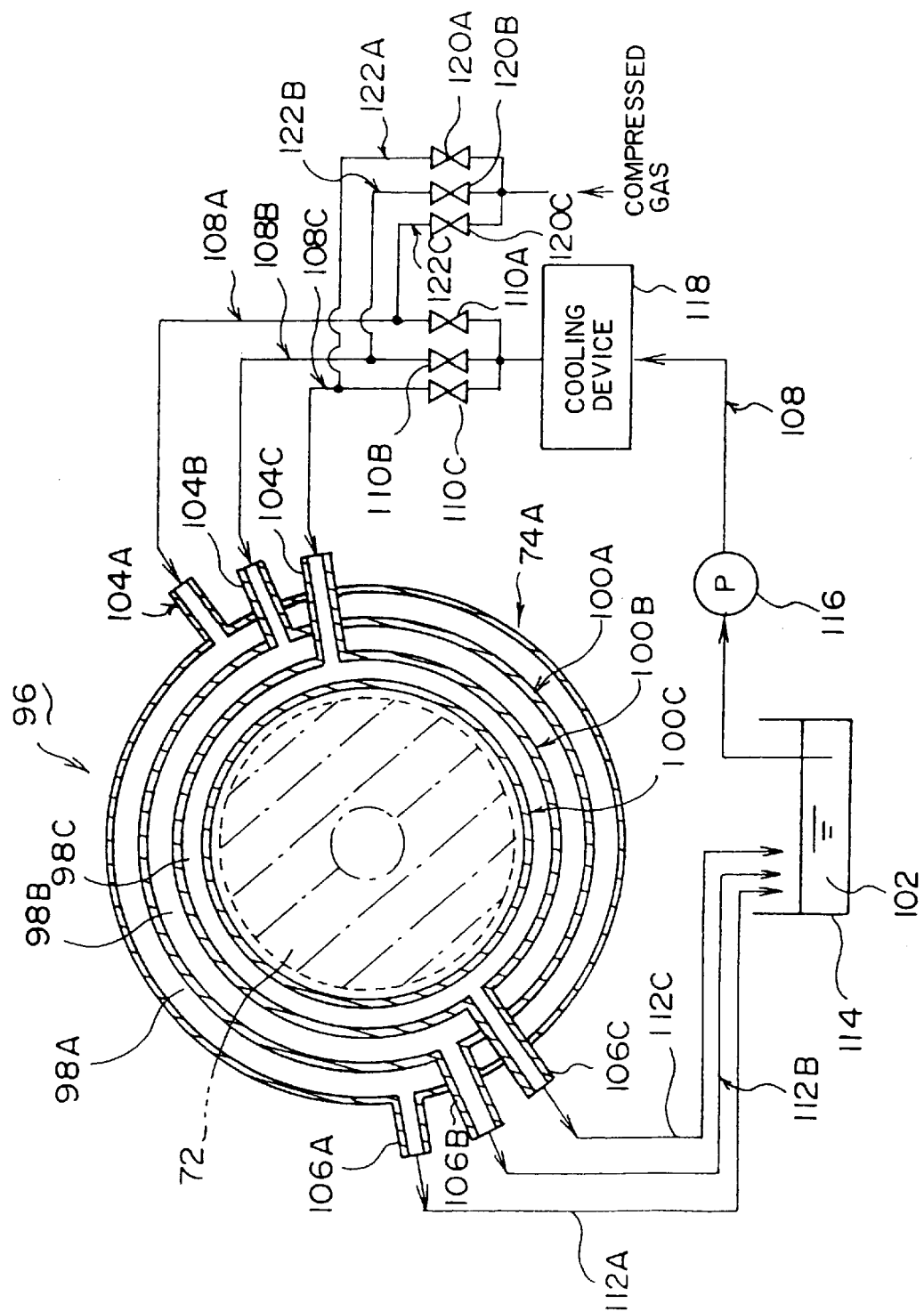
FIG. 3 is a cross-sectional view of a microwave absorbing means included in the plasma etching system shown in FIG. 1.

A plasma processing system in a preferred embodiment according to the present invention will be described with reference to the accompanying drawings. FIG. 1 is a typical longitudinal sectional view of a plasma etching system as a plasma processing system in a preferred embodiment according to the present invention, FIG. 2 is a plan view of a plane antenna included in the system shown in FIG. 1 and FIG. 3 is a cross-sectional view of a microwave absorbing device included in the system shown in FIG. 1. The plasma processing system in the preferred embodiment is a plasma etching system. Referring to FIG. 1, a plasma etching system 20 has a processing vessel 22 defining a sealed processing space S. The processing vessel 22 has a sidewall and a bottom wall formed of a conductive material, such as aluminum. The processing vessel 20 is formed in a generally cylindrical shape and has a radially reduced upper portion. An upper region of the processing space S in the processing vessel 22 serves as a plasma producing space S1.

A table 24 for supporting, for example, a semiconductor wafer W, served as an object to be processed, is disposed in the processing vessel 22. The table 24 is formed of, for example, aluminum in a substantially cylindrical shape and is finished by anodizing (Alumite process). The table 24 has a raised, flat central portion. The table 24 is mounted on a base 26 formed of aluminum or the like in a cylindrical shape. The base is placed on the inner surface of the bottom wall of the processing vessel 22 coated with an insulating layer 28.

An electrostatic chuck capable of attracting and holding a wafer W or a clamping mechanism, not shown, is placed on the upper surface of the table 24. A biasing high-frequency power supply 34 is connected through a matching box 32 to the table 24 by a feeder line 30 to apply a bias voltage of, for example, 13.56 MHz to the table 24. The base 26 supporting the table 24 is provided with a cooling gallery 36 through which cooling water or the like is passed to cool the wafer during a plasma process.

A processing gas supply nozzle 38 of, for example, quartz is connected to the side wall of the processing vessel 22 defining the processing chamber S to supply an etching gas into the processing space S. The processing gas supply nozzle 38 is connected through a mass-flow controller 42 and a stop valve 44 to a processing gas source 46 by a gas supply line 40.

The etching gas, i.e., a processing gas, may be any one of monogases including $CHF_3$ gas, $CF_4$ gas and $C_4F_8$ gas, or a mixed gas of hydrogen and some of those monogases. A gas supply nozzle 48 of, for example, quartz is connected to the side wall of the processing vessel 22 to supply an inert gas, such as Ar (argon) gas, as a plasma producing gas at a controlled flow rate.

An annular magnet 50 for creating an ECR magnetic field in the plasma producing space S1 is disposed so as to surround the radially reduced portion of the processing vessel 22. The side wall of the processing vessel 22 is provided with a gate valve 52 through which a wafer is carried into and carried out of the processing vessel 22. A discharge port 54 formed in the bottom wall of the processing vessel 22 is connected to a vacuum pump, not shown, to evacuate the processing vessel 22 to a predetermined pressure when necessary.

A microwave transmitting window 60 of, for example, quartz is put on the top wall of the processing vessel 22 to introduce microwaves into the processing vessel 22. The microwave transmitting window 60 is attached hermetically to the top wall of the processing vessel 22 with a sealing member 58, such as an O-ring held between the microwave transmitting window 60 and the top wall so as to cover an opening 56 of a diameter equal to or greater than the diameter of the wafer W. A disk-shaped plane antenna 62 is disposed on the upper surface of the microwave transmitting window 60 with a sealing member 66 held between the microwave transmitting window 60 and the plane antenna 62.

A substantially disk-shaped slow-wave member 72 of a dielectric material, such as a ceramic material, is bonded to the upper surface of the plane antenna 62 with an adhesive or the like. A through hole 73 is formed in a central portion of the slow-wave member 72. A coaxial line 90 is passed through the through hole 73. The slow-wave member 72 reduces the propagating speed of microwaves falling thereon to reduce the wavelength of the microwaves in order that the microwave radiation efficiency of the plane antenna 62 is improved. An antenna box 74 of a metal, such as aluminum, is put on the plane antenna 62 so as to cover the slow-wave member 72.

The plane antenna 62 is formed of a conductive material, such as copper or aluminum, and is provided with a plurality of circumferential slits 80 formed on concentric circles as shown in FIG. 2. The length and radial pitch of the slits 80 depend on the guide wavelength (wavelength determined by the slow-wave member 72).

In this embodiment, the radial pitch L1 of the slits 80 of the plane antenna 62 is far less than the guide wavelength of the microwaves. The pitch L1 is, for example, in the range of about 1/20 to 1/30 of the guide wavelength. Since the plurality of slits 80 are formed at such a small radial pitch, the microwaves leak little by little through the slits 80 as the same spread radially from the central portion of the plane antenna 62.

As shown in FIG. 1, a microwave generator 86 generates microwaves of, for example, 2.45 GHz. The microwaves generated by the microwave generator 86 is guided by a rectangular waveguide 88 to a rectangular/coaxial converter 95 and are transmitted by the converter 95 through the coaxial line 90 to a central portion of the plane antenna 62. The rectangular waveguide 88, the rectangular/coaxial converter 95 and the coaxial line 90 constitute a waveguide means for guiding the microwaves generated by the microwave generator 86 to the central portion of the plane antenna 62.

More concretely, the coaxial line 90 is extended from the rectangular/coaxial converter 95 through an opening 92 formed in a central portion of the antenna box 74 and the through hole 73 formed in the slow-wave member 72 and is connected to the central portion of the plane antenna 62. The frequency of the microwaves is not limited to 2.45 GHz, but may be a frequency in the range of 1 GHz to several tens GHz. A matching circuit 93 for impedance matching is placed in the rectangular waveguide 88.

A microwave absorbing means 96, which is a feature of the present invention, is disposed on a peripheral portion of the plane antenna 62 in a space between the slow-wave member 72 and the side wall 74A of the antenna box 74. The side wall 74A of the antenna box 74 surrounding the plane antenna 62 serves as a microwave reflecting member that reflects microwaves, which is propagated from the central portion toward the peripheral portion of the plane antenna 62, toward the central portion of the plane antenna 62. The microwave absorbing means 96 absorbs part of the microwave propagating from the central portion of the plane antenna 62 and reflected from the peripheral portion of the same.

More concretely, the microwave absorbing means 96 has a plurality of concentric, annular liquid containers, three liquid containers 98A, 98B and 98C in this embodiment, formed between the circumference of the slow-wave member 72 and the side wall 74A of the antenna box 74 as shown in FIGS. 1 and 3. The liquid containers 98A, 98B and 98C are arranged radially in three layers on the plane antenna 62. The thicknesses of the liquid containers 98A, 98B and 98C are determined so that the liquid containers 98A, 98B and 98C containing a microwave absorbing liquid 102 absorb predetermined amounts of microwaves, respectively. In FIG. 3, the liquid containers 98A, 98B and 98C are shown in thicknesses greater than actual thicknesses to facilitate understanding.

Walls 100A, 100B and 100C forming the liquid containers 98A, 98B and 98C shown in FIG. 3 are formed of a dielectric material that transmits microwaves efficiently, such as a fluorocarbon resin. The microwave absorbing liquid 102 capable of causing a large dielectric loss can be selectively introduced in the liquid containers 98A, 98B and 98C. The microwave absorbing liquid 102 may be water, which is inexpensive.

Liquid supply ports 104A, 104B and 104C are formed on one side of the liquid containers 98A, 98B and 98C, respectively. Drain ports 106A, 106B and 106C are formed on the other side of the liquid containers 98A, 98B and 98C, respectively. Branch circulation lines 108A, 108B and 108C respectively provided with stop valves 110A, 110B and 110C are connected to the liquid supply ports 104A, 104B and 104C, respectively.

Branch discharge lines 112A, 112B and 112C are connected to the drain ports 106A, 106B and 106C. The branch drain lines 112A, 112B and 112C are connected to a tank 114 for containing the microwave absorbing liquid 102. A circulation line 108 provided with a pump 116 and a cooling device 118 is connected to the tank 114. The circulation line 108 branches at a point below the cooling device 118 into the branch circulation lines 108A, 108B and 108C.

Blowing lines 122A, 122B and 122C respectively provided with stop valves 120A, 120B and 120C are connected to the branch circulation lines 108A, 108B and 108C, respectively. A compressed gas is supplied into the blowing lines 122A, 122B and 122C to discharge the microwave absorbing liquid 102 selectively from the liquid containers 98A, 98B and 98C.

The operation of the plasma etching system thus constructed will be described hereinafter.

Referring to FIG. 1, the gate valve 52 is opened and a semiconductor wafer W is carried through the gate valve 52 into the processing vessel 22 by a transfer arm, not shown. Lifting pins, not shown, are moved vertically to mount the wafer W on the table 24.

The etching gas, such as $CF_4$, is supplied through the processing gas supply nozzle 38 at a controlled flow rate into the processing vessel 22. Ar gas, i.e., the plasma gas, is supplied through the gas supply nozzle 48 into the processing vessel 22. In some cases, Ar gas is not supplied. The atmosphere in the processing vessel 22 is discharged through the discharge port 54 to adjust the pressure in the processing vessel 22 to a predetermined process pressure in the range of, for example, 0.1 to several tens mTorrs.

At the same time, microwaves generated by the microwave generator 86 are guided to the plane antenna 62. Consequently, an electromagnetic field is created in the plasma producing space S1 and the processing space S, the processing gas is ionized to produce a plasma for an etching process.

Microwaves of, for example, 2.45 GHz generated by the microwave generator 86 are propagated through the rectangular waveguide 88, the rectangular/coaxial converter 95 and the coaxial line 90 to a space enclosed by the plane antenna 62 and the antenna box 74. Then, the microwaves propagate radially outward along the plane antenna 62. The microwaves leak little by little through the plurality of slits 80 (FIG. 2) formed at the small pitch in the plane antenna 62 as the same propagate radially along the plane antenna 62.

The microwaves reached the peripheral portion of the plane antenna 62 are reflected toward the center of the plane antenna 62 by the side wall 74A of the antenna box 74 made of a metal. As the microwaves propagate between the central portion of the plane antenna 62 and the side wall 74A of the antenna box 74, the microwaves leak little by little through the slits 80 formed at the small pitch. The microwaves leaked through the slits 80 propagate through the microwave transmitting window 60 into the plasma producing space S1. Then, the microwaves and a magnetic field created by the magnet 50 cause electron cyclotron resonance.

Since the microwaves are reflected toward the center of the plane antenna 62 by the side wall 74A of the antenna box 74 surrounding the plane antenna 62, there is a tendency for electromagnetic field intensity around the center of the plane antenna 62 to be higher than that around the peripheral portion of the same. Therefore, the microwaves returning from the peripheral portion toward the central portion of the plane antenna 62 is controlled by disposing the microwave absorbing means 96 that absorbs the microwaves moderately on the peripheral portion of the plane antenna 62. Thus, excessive increase in electromagnetic field intensity in the central portion of the plane antenna 62 is suppressed and, consequently, electromagnetic field intensity is distributed uniformly, i.e., electromagnetic field intensity is distributed in a flat distribution form.

The microwaves can be absorbed by the microwave absorbing means 96 when liquid containers 98A, 98B and 98C are filled with the microwave absorbing liquid as shown in FIG. 3. While the microwaves travels through the microwave absorbing liquid 102 contained in the liquid containers 98A, 98B and 98C, the microwaves are attenuated due to dielectric loss caused by the microwave absorbing liquid by a degree proportional to the length of a path through the microwave absorbing liquid 102.

Selective supply of the microwave absorbing liquid 102 to the liquid containers 98A, 98B and 98C is determined by selectively opening the stop valves 110A, 110B and 110C placed in the branch circulation lines 108A, 108B and 108C. The microwave absorbing liquid 102 can be selectively drained from the liquid containers 98A, 98B and 98C by selectively supplying the compressed gas into the blowing lines 122A, 122B and 122C.

The length of the path through the microwave absorbing liquid 102 can be selectively changed by selectively filling the desired ones of the three liquid containers 98A, 98B and 98C with the microwave absorbing liquid 102. Thus, the amount of the microwaves reflected in the peripheral portion of the plane antenna 62 can be properly controlled by controlling the absorbed amount of the microwaves. When the liquid containers 98A, 98B and 98C are arranged in three concentric layers as shown in FIG. 3, the absorbed amount of the microwaves can be changed in four steps.

Figure 4:
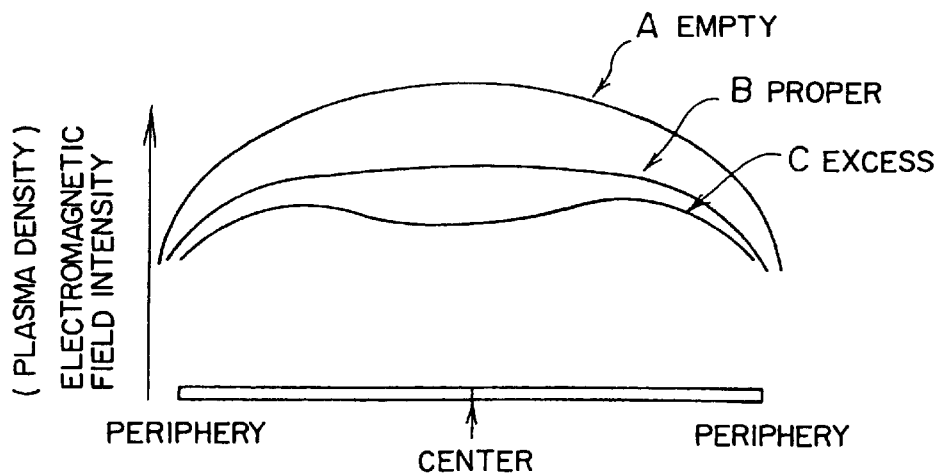
FIG. 4 is a graph showing electromagnetic field intensity distributions (plasma density distributions) for different numbers of liquid containers filled with water.
Figure 5:
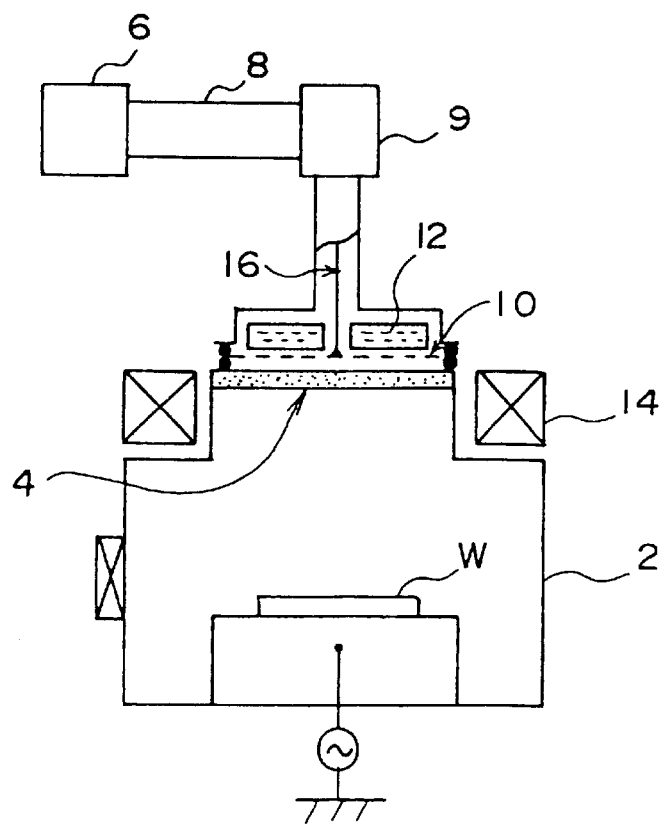
FIG. 5 is a typical longitudinal sectional view of a conventional plasma processing system.
Figure 6:
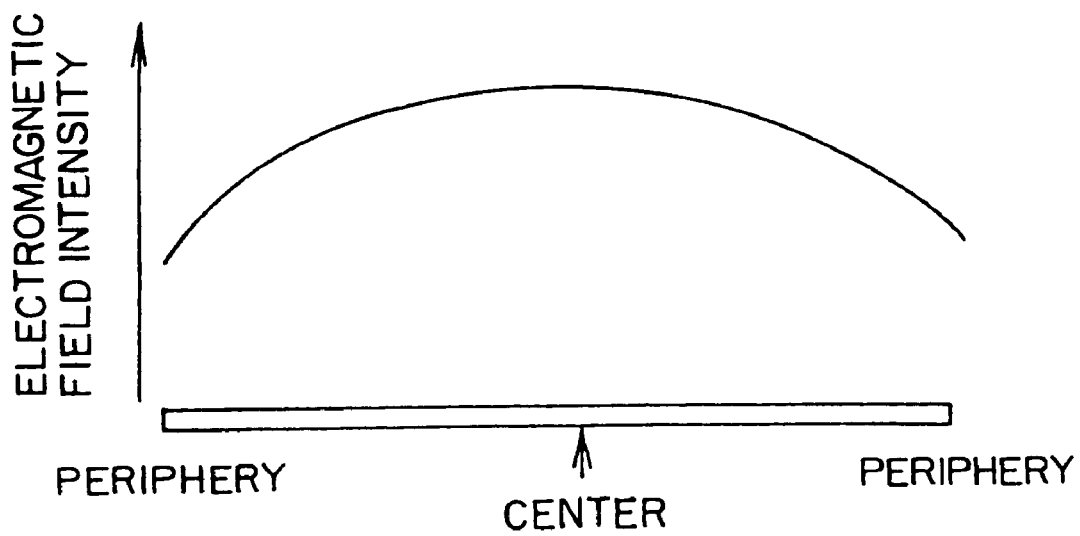
FIG. 6 is a graph showing an electromagnetic field intensity distribution formed by the conventional plasma processing system.

FIG. 4 shows a graph showing the dependence of the mode of plasma density distribution over a wafer on the number of the liquid containers 98A, 98B and/or 98C containing water, served as the microwave absorbing liquid 102. When all the liquid containers 98A, 98B and 98C do not contain water, the reflected microwaves are not absorbed and an excessively large amount of the microwaves is reflected. Consequently, electromagnetic field intensity in a region around the center of the wafer is increased particularly and plasma density distribution is uneven as indicated by a curve A. Such an unsatisfactory uniformity of the plasma is similar to that in the conventional plasma processing system previously described with reference to FIG. 6.

If the number of the liquid containers containing water is excessively large, electromagnetic field intensity in the region around the center of the wafer is lower than those in the surrounding regions and plasma density distribution is unsatisfactory as indicated by a curve C, which is considered to be a natural result of the excessive absorption of the microwaves. When water is contained in a proper number of the liquid containers, the reflected microwaves are absorbed properly and plasma densities are distributed in a uniform distribution as indicated by a curve B. Thus, the uniformity of plasma density distribution can be greatly improved.

The half-value depth of water that absorbs 2.45 GHz microwaves, i.e., the depth of water that attenuates the energy of the microwaves by half, is on the order of 1.3 cm. Since the microwaves are reflected by the side wall 74A of the antenna box 74 surrounding the liquid containers 98A, 98B and 98C, the microwave absorbing effect of water contained in the liquid container is proportional to twice the radial thickness of the liquid container. Thus, the radial thicknesses of the liquid containers 98A, 98B and 98C need not be very great.

The number of the liquid containers of the microwave absorbing means 96 is not limited to three. The microwave absorbing means 96 may be provided with any number of liquid containers, provided that a space for liquid containers is available. The plurality of liquid containers may have different radial thicknesses, respectively. The absorbed amount of microwaves can be changed in smaller steps by changing the combination of the liquid containers of different radial thicknesses containing the microwave absorbing liquid 102 to achieve more accurate, fine control of the electromagnetic field intensity distribution.

Although the preferred embodiment employs inexpensive water as the microwave absorbing liquid 102, the microwave absorbing liquid 102 may be any liquid, provided that the liquid is capable of causing large dielectric loss. The material of the walls 100A, 100B and 100C forming the liquid containers 98A, 98B and 98C is not limited to a fluorocarbon resin but may be any suitable insulating material that causes only small dielectric loss, such as quartz glass or a polyimide resin.

The temperature of the microwave absorbing liquid 102 contained in the liquid containers 98A, 98B and 98C rises when the microwave absorbing liquid 102 absorbs microwaves to cause a dielectric loss. As shown in FIG. 3, the microwave absorbing liquid 102 is cooled by the cooling device (cooling means) 118 while the same is circulated through the liquid containers 98A, 98B and 98C by the pump (circulating means) 116 to suppress the rise of the temperature of the microwave absorbing liquid 102. Thus, the variation of dielectric loss due to the variation of the temperature of the microwave absorbing liquid 102 can be prevented, so that the field intensity distribution of the electromagnetic field created by the microwaves can be further stably controlled.

Although the invention has been described as applied to the ECR type plasma processing system, the present invention is not limited thereto in its practical application and may be applied to all kinds of plasma processing systems in which microwaves are introduced into a processing vessel through a plane antenna.

Although the invention has been described as applied to the plasma etching system, naturally, the present invention is applicable also to plasma sputtering systems, plasma ashing systems or plasma CVD systems. The object to be processed is not limited to a semiconductor wafer, but may be an LCD substrate or a glass substrate.

What is claimed is:

1. A plasma processing system comprising:

a processing vessel in which an object to be processed is subjected to a plasma process;

a plane antenna that makes microwaves propagate from its central portion toward its peripheral portion;

a microwave generator for generating microwaves to be propagated to the plane antenna;

a waveguide means for guiding the microwaves generated by the microwave generator to a central portion of the plane antenna;

a microwave reflecting member surrounding a peripheral portion of the plane antenna to reflect microwaves, which is propagated from the central portion toward the peripheral portion of the plane antenna, toward the central portion of the plane antenna; and a microwave absorbing means disposed in the peripheral portion of the plane antenna to controllably absorb part of the microwaves that propagate therethrough.

2. The plasma processing system according to claim 1, wherein the microwave absorbing means includes:

a plurality of concentric, annular liquid containers disposed in a peripheral portion of the plane antenna; and a microwave absorbing liquid selectively contained in one or more of the liquid containers to cause a dielectric loss.

3. The plasma processing system according to claim 2, wherein the liquid containers have different radial thicknesses, respectively.

4. The plasma processing system according to claim 2 or 3, further comprising:

a circulating means for circulating the microwave absorbing liquid outside the liquid container(s); and a cooling means for cooling the microwave absorbing liquid circulated by the circulating means.

* * * * *